(12) United States Patent
Wada et al.

(10) Patent No.: US 12,438,551 B2
(45) Date of Patent: Oct. 7, 2025

(54) ANALOG-TO-DIGITAL CONVERTER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shotaro Wada, Nisshin (JP); Tomohiro Nezuka, Nisshin (JP); Yoshikazu Furuta, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 131 days.

(21) Appl. No.: 18/391,789

(22) Filed: Dec. 21, 2023

(65) Prior Publication Data
US 2024/0259030 A1    Aug. 1, 2024

(30) Foreign Application Priority Data

Jan. 30, 2023   (JP) .................................. 2023-012067

(51) Int. Cl.
*H03M 1/44*    (2006.01)
*H03M 1/18*    (2006.01)

(52) U.S. Cl.
CPC ........... *H03M 1/442* (2013.01); *H03M 1/181* (2013.01)

(58) Field of Classification Search
CPC .......... H03M 1/18; H03M 1/44; H03M 1/442; H03M 1/181; H03M 1/124; H03M 1/0854; H03M 3/34
See application file for complete search history.

(56) References Cited

U.S. PATENT DOCUMENTS

| | | | |
|---|---|---|---|
| 4,110,747 A * | 8/1978 | LaBrie | H03M 1/60 341/164 |
| 6,201,835 B1 * | 3/2001 | Wang | H03M 3/34 375/247 |

(Continued)

OTHER PUBLICATIONS

Pertijs, Michiel A.P., "A CMOS Smart Temperature Sensor With a 3σ Inaccuracy of ±0.1° C From -55° to 125° C," IEEE Journal of Solid-State Circuits, vol. 40, No. 12, Dec. 2005, pp. 2805-2815.

*Primary Examiner* — Lam T Mai
(74) *Attorney, Agent, or Firm* — Posz Law Group, PLC

(57) ABSTRACT

An analog-to-digital converter includes an input-signal chopping switch, an integrator, an output chopping switch, a quantizer, and a feedback switch. The integrator is located after the input-signal chopping switch. The integrator includes an operational amplifier, an integral capacitor, and an integral-capacitor-chopping input switch being at on an input side of the integral capacitor. The output chopping switch is on an output side of the operational amplifier. The quantizer is located after the output chopping switch. The feedback chopping switch is in a feedback path from an output of the quantizer to an input of the first integrator. The input-signal chopping switch, the integral-capacitor-chopping input switch, the output chopping switch, and the feedback chopping switch execute chopping at an identical frequency. The output chopping switch sets a polarity of an input value of the quantizer to be identical before and after the chopping.

12 Claims, 16 Drawing Sheets

(56) References Cited

U.S. PATENT DOCUMENTS

| | | | | |
|---|---|---|---|---|
| 7,138,932 B1* | 11/2006 | Chen | H03M 3/398 | 341/110 |
| 7,250,886 B1* | 7/2007 | Killat | H03K 17/0416 | 341/150 |
| 7,362,255 B1* | 4/2008 | Tsyrganovich | H03M 3/34 | 341/172 |
| 8,009,077 B1* | 8/2011 | Melanson | H03M 3/368 | 341/143 |
| 8,232,905 B2* | 7/2012 | Steensgaard-Madsen | H03M 1/162 | 341/161 |
| 9,219,494 B2* | 12/2015 | Liu | H03M 1/005 | |
| 10,291,247 B1* | 5/2019 | Verbruggen | H03M 1/0836 | |
| 10,355,709 B1* | 7/2019 | Sharma | H03M 3/464 | |
| 10,615,818 B1* | 4/2020 | Singh | H03M 3/496 | |
| 11,777,516 B2* | 10/2023 | Melanson | H03M 3/344 | 341/143 |
| 2007/0013566 A1* | 1/2007 | Chuang | H03M 3/34 | 341/143 |
| 2010/0164616 A1* | 7/2010 | Balachandran | H03F 3/393 | 330/9 |
| 2010/0289682 A1* | 11/2010 | Groenewold | H03M 3/34 | 341/143 |
| 2010/0309032 A1* | 12/2010 | Uo | H03M 3/34 | 341/110 |
| 2011/0063146 A1* | 3/2011 | Matthews | H03M 3/34 | 341/118 |
| 2011/0115661 A1* | 5/2011 | Steensgaard-Madsen | H03M 1/162 | 341/155 |
| 2011/0215955 A1* | 9/2011 | Motz | H03M 1/02 | 341/110 |
| 2013/0335247 A1* | 12/2013 | Ceballos | H03M 3/344 | 341/143 |
| 2015/0109159 A1* | 4/2015 | Liu | H03M 1/005 | 341/143 |
| 2015/0295587 A1* | 10/2015 | Garcia Gonzalez | H03M 1/1019 | 341/120 |
| 2016/0043733 A1* | 2/2016 | Nezuka | H03M 3/464 | 341/143 |
| 2019/0097647 A1* | 3/2019 | Imaizumi | H03M 3/34 | |
| 2022/0263519 A1 | 8/2022 | Melanson et al. | | |
| 2022/0263520 A1 | 8/2022 | Thomsen et al. | | |
| 2023/0102232 A1* | 3/2023 | Breems | H03M 3/34 | 341/143 |
| 2023/0126107 A1* | 4/2023 | Wada | H03K 5/15026 | 327/117 |
| 2023/0421170 A1* | 12/2023 | Wada | H03M 3/454 | |

* cited by examiner

ANALOG-TO-DIGITAL CONVERTER

CROSS REFERENCE TO RELATED APPLICATION

This application is based on Japanese Patent Application No. 2023-012067 filed on Jan. 30, 2023, the disclosure of which is incorporated herein by reference.

TECHNICAL FIELD

The present disclosure relates to an analog-to-digital (A/D) converter.

BACKGROUND

An A/D converter may include an integrator to execute chopping.

SUMMARY

The present disclosure describes an A/D converter a input-signal chopping switch, an integrator, at least one output chopping switch, a quantizer, and a feedback chopping switch.

DETAILED DESCRIPTION

Figure 1:
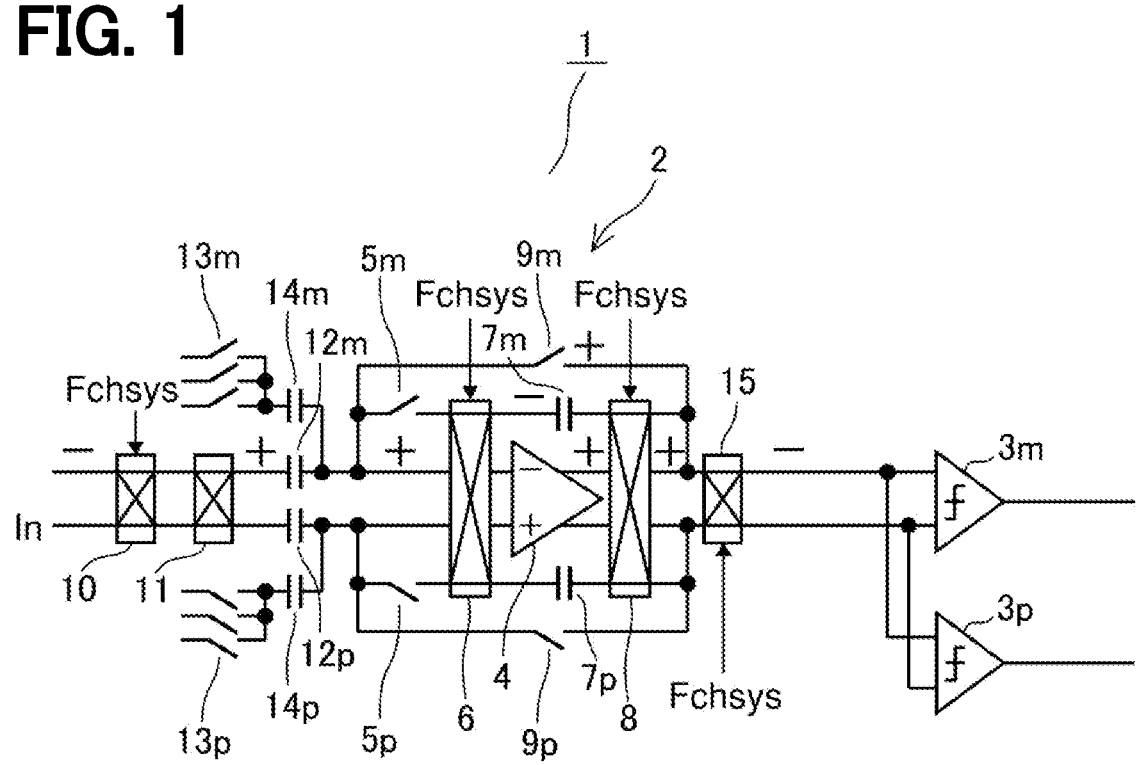
FIG. 1 illustrates a structure of an A/D converter according to a first embodiment.

The following describes an example of a structure of an A/D converter. In the A/D converter, chopping switches may be provided at an input and an output of the A/D converter and an input and an output of an integral capacitor included in the integrator, and these chopping switches execute chopping at the identical frequency.

A quantizer may be provided at an output of the A/D converter. The polarity of a value provided to the quantizer is inverted before and after the chopping switch. For example, in a structure illustrated in FIG. 3 related to a comparative example, chopping switches are provided at an input and an output of a quantizer, respectively. When the input signal of the quantizer is inverted by chopping, the output signal of the quantizer after the chopping is in a normal rotation. Therefore, the signal polarity at the input and output is inverted.

In addition, a digital-to-analog converter (DAC) is omitted at a feedback path that runs from the output terminal of the quantizer through a gain element. In order to control the output timing of the DAC to be appropriate before and after chopping, it may be necessary to consider not only the output timing but also the timing of the determination and output of the quantizer. Thus, the timing control may be complicated.

According to a first aspect of present disclosure, an analog-to-digital (A/D) converter includes an input-signal chopping switch, an integrator, at least one output-side chopping switch and a feedback chopping switch. The integrator is located after the input-signal chopping switch, the integrator including an operational amplifier, an integral capacitor, and a capacitor-chopping input switch. The capacitor-chopping input switch is located on an input side of the integral capacitor. The at least one output-side chopping switch is located on an output side of the operational amplifier. The quantizer is located after the at least one output-side chopping switch. The feedback chopping switch located in a feedback path from an output of the quantizer to an input of the integrator. The input-signal chopping switch, the capacitor-chopping input switch, the at least one output-side chopping switch, and the feedback chopping switch executes chopping at an identical frequency. The at least one output-side chopping switch sets a polarity of an input value of the quantizer to be identical before and after the chopping.

The input-signal chopping switch, the output-side chopping switch, the feedback chopping switch, and the capacitor-chopping input switch execute chopping at the identical frequency. The output-side chopping switch is arranged so that the polarity of the input value of the quantizer is identical before and after the chopping. With such a structure, the A/D converter can operate normally only by appropriately controlling the timing of the signal provided to the first integrator via the feedback path. Therefore, signal timing control is simpler than in the control described in the comparative example.

According to a second aspect of the present disclosure, when a short-circuit switch is incorporated into the A/D converter, the short-circuit switch short-circuits a path between the input terminal of the operational amplifier and the output terminal of the operational amplifier. An input terminal of one output-side chopping switch is connected to a common connection node between the output terminal of the operational amplifier and one end of the short-circuit switch, and the output terminal of the one output-side chopping switch is connected to a common connection node between an input terminal of the quantizer and one end of the integral capacitor. Accordingly, the polarity of the input value of the quantizer is identical before and after the chopping.

According to a third aspect of the present disclosure, the A/D converter includes the structure according to the first aspect described above and an amplifier-input chopping switch. The amplifier-input chopping switch is connected to an input terminal of the operational amplifier. The amplifier-input chopping switch executes chopping at a frequency being higher than the input-signal chopping switch. The input-signal chopping switch, the feedback chopping switch, and the capacitor-chopping input switch execute chopping at an identical frequency. an input terminal of the at least one output-side chopping switch is connected to an output terminal of the operational amplifier, and an output terminal of the at least one output-side chopping switch is connected to a common connection node between an input terminal of the quantizer and one end of the integral capacitor. The at least one output-side chopping switch executes chopping through an exclusive-OR signal acquired by a result of an exclusive-OR operation of a first signal and a second signal. The first signal causes the amplifier-input chopping switch to execute the chopping, and the second signal causes the input-signal chopping switch to execute the chopping.

Even though the amplifier-input chopping switch is included in the structure mentioned above, it is possible to acquire the same effect as the structure according to the first aspect by chopping the output chopping switch through the exclusive-OR signal acquired by a result of the exclusive-OR operation of the first signal and the second signal. Thus, it is possible to provide only one output-side chopping switch.

First Embodiment

As shown in FIG. 1, an A/D converter 1 according to a first embodiment has a differential structure, and includes a first integrator 2 and a quantizer 3. In the following description, unless it is necessary to distinguish between the positive side "p" and the negative side "m" for a symmetrical differential configuration, p and m will not be particularly added to the symbols. The first integrator 2 includes a series circuit in which a first operational amplifier 4, a switch 5, a first-capacitor-chopping input switch 6, a first integral capacitor 7 and a second output chopping switch 8 are connected in series and a short-circuit switch 9. The switch 5 is connected between input and output terminals of the first operational amplifier 4. The first-capacitor-chopping input switch 6 is provided at the input of the first integrator 2 for chopping the first integral capacitor 7. The second output chopping switch 8 is provided at the output of the first integrator 2. The first integrator 2 is a correlated double sampling (CDS) integrator.

A series circuit in which a input-signal chopping switch 10, a double-sampling (DS) chopping switch 11, and an input capacitor 12 are connected in series is connected to the input terminal of the first integrator 2. The input-signal chopping switch 10 is provided for chopping an input signal. A series circuit in which a DAC input switch 13 and a DAC capacitor 14 are connected is connected to the input terminal of the first integrator 2. Although not shown in FIG. 1, the above-mentioned series circuit is adopted as a connection portion of a feedback from the output of the quantizer 3 to the input of the first integrator 2. The DAC input switch 13 switches the outputs from the multiple D/A converters in the feedback path, and provides them to the first operational amplifier 4. A first output chopping switch 15 is connected between the output terminal of the first integrator 2 and the input terminal of the quantizer 3. The first output chopping switch 15 is provided on the output side of the first integrator 2.

The chopping switches 6, 8, 10, 15 and a feedback chopping switch 16 adopted for feedback execute chopping at the identical frequency Fchsys. The double-sampling chopping switch 11 is a switch adopted for double sampling of the A/D converter 1, and executes chopping at a frequency higher than the frequency Fchsys.

Figure 2:
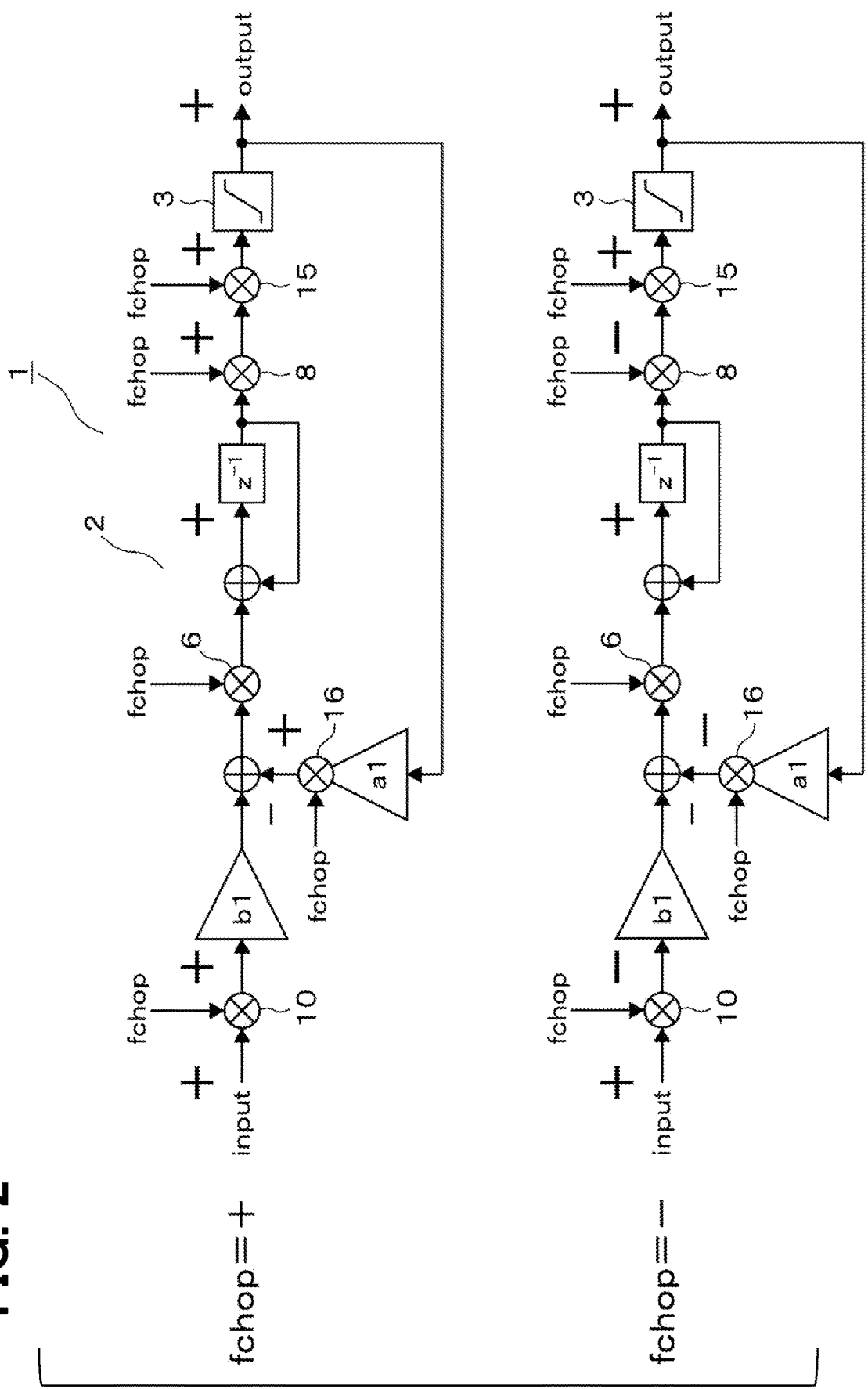
FIG. 2 illustrates a model of an A/D converter omitting the illustration of a differential structure.
Figure 3:
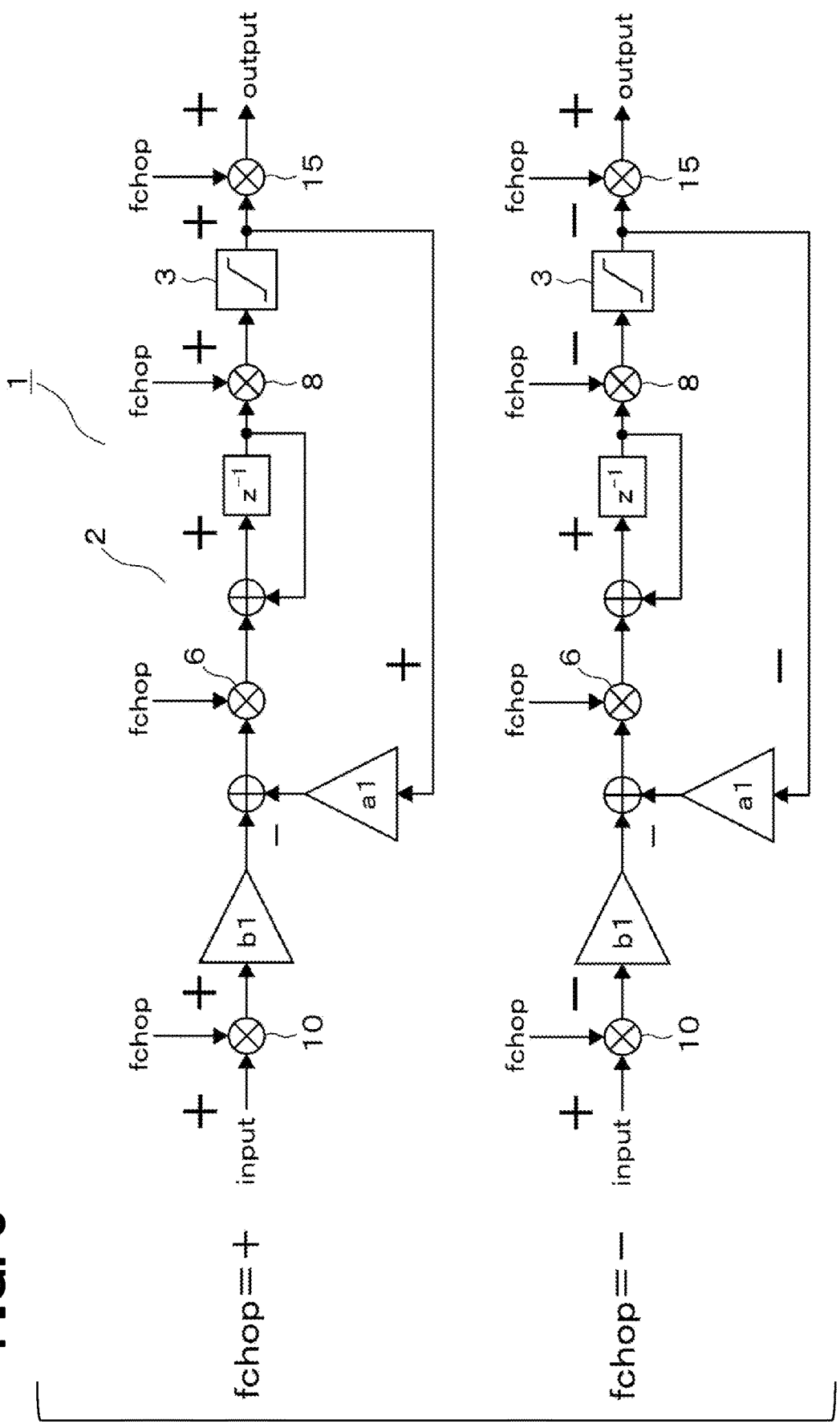
FIG. 3 illustrates a comparative example, and is a drawing corresponding to FIG. 2.

The following describes an operation in the present embodiment. In FIG. 2, the A/D converter 1 is shown as a model omitting the illustration of a differential structure. Although the above-mentioned feedback path and the feedback chopping switch 16 in the feedback path are shown, the D/A converter is not shown. FIG. 3 shows a comparative structure on a level with FIG. 2. In the comparative structure, there are no switches corresponding to the chopping switches 15, 16 according to the present embodiment. There is no fault if the chopping polarity fchop is positive. However, if the polarity fchop becomes negative, the polarity of the input value of the quantizer will not be identical before and after the chopping.

In this case, in order to ensure the normal operation of the A/D converter, it is necessary to control the timing of the signal output from the DAC in the feedback path before and after the chopping so that it becomes appropriate. This control needs to take into account the timing of signal detection and output in the quantizer as well as the signal output timing of the DAC. Therefore, timing control becomes complicated.

In contrast, in the A/D converter 1 according to embodiment shown in FIG. 2, by incorporating the chopping switches 15 and 16, even when the polarity fchop becomes negative, the polarity of the input value of the quantizer 3 is identical before and after the chopping operation. Therefore, timing control becomes easier as it is solely focused on the signal output timing of the DAC. In other words, the control of the determination timing of the quantizer 3 and the output timing of the DAC does not need to take into account the influence of switching of chopping. FIG. 1 shows how the polarity of each node becomes when the polarity of the input voltage is negative.

According to the above embodiment, the A/D converter 1 includes the first integrator 2, the quantizer 3, the input-signal chopping switch 10, the first-capacitor-chopping input switch 6, the second output chopping switch 8, the first output chopping switch 15 and the sixth chopping switch 16. The input-signal chopping switch 10 is adopted for receiving an input signal. The second output chopping switch 8 and the first output chopping switch 15 are located on the output side of the first operational amplifier 4. The feedback chopping switch 16 is located in the feedback path from the output of the quantizer 3 to the input of the first integrator 2.

The chopping switches 6, 8, 10, 15 and 16 execute chopping operation at the same frequency Fchsys. The second output chopping switch 8 and the feedback chopping switch 16 are arranged so that the polarity of the input value of the quantizer 3 is identical before and after the chopping operation. With such a configuration, signal timing control becomes easier than in the conventional configuration. As compared with the comparative example, since one additional chopping switch stage is provided for the quantizer 3, the A/D converter 1 is less susceptible to kickback noise from the quantizer 3.

Second Embodiment

Figure 4:
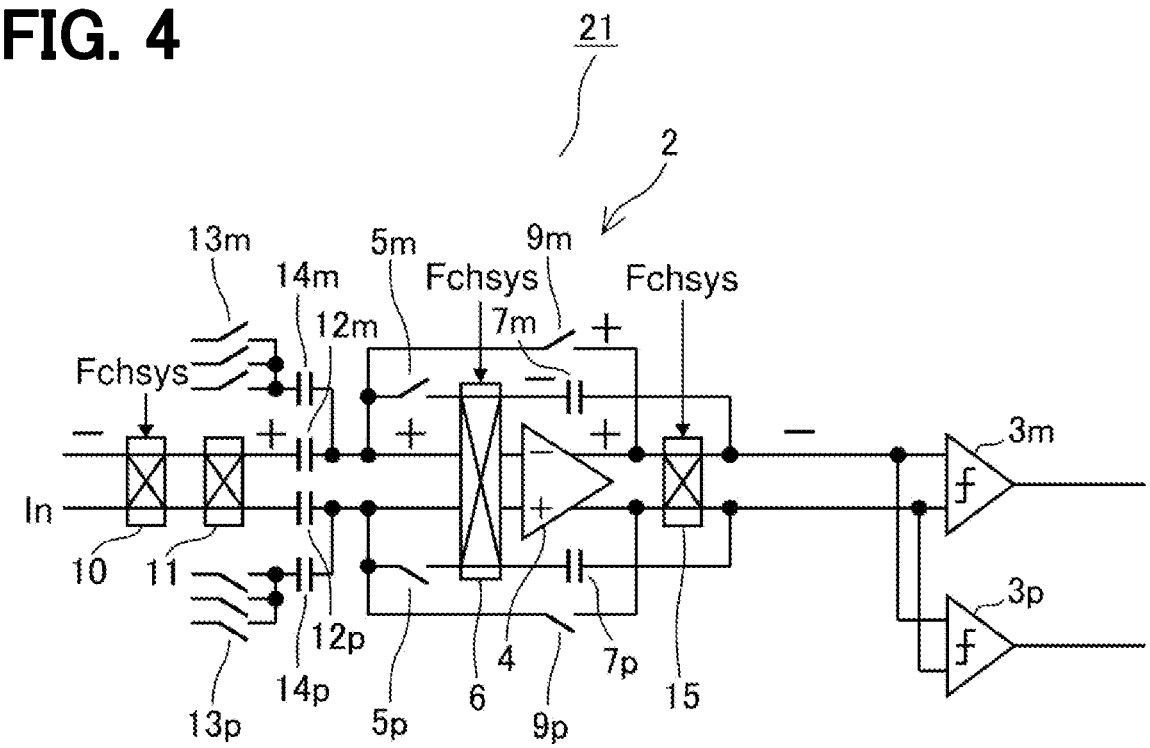
FIG. 4 illustrates a structure of an A/D converter according to a second embodiment.
Figure 5:
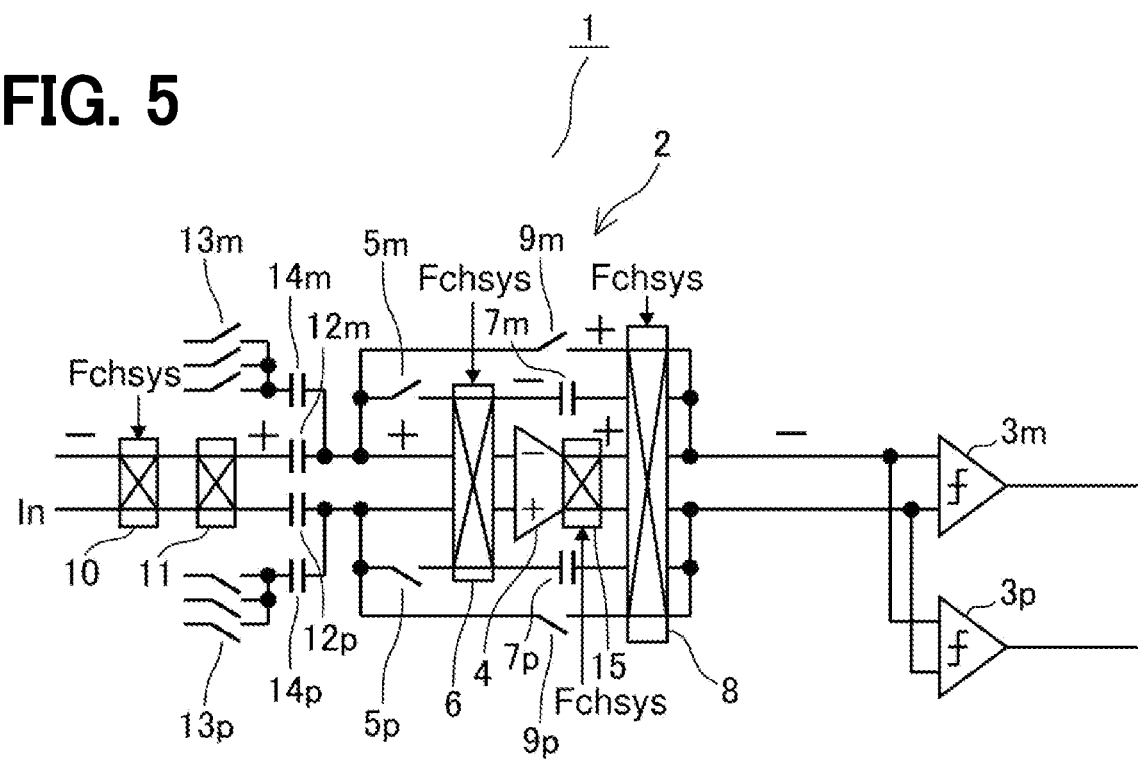
FIG. 5 illustrates a structure equivalent to the A/D converter according to the first embodiment.

Hereinafter, the same components as those of the first embodiment are denoted by the same reference numerals, and descriptions of the same components will be omitted, and different portions will be described. As shown in FIG. 4, the A/D converter 21 according to a second embodiment has a structure in which the number of chopping switches is reduced compared to structure of the A/D converter 1. FIG. 5 shows the arrangement of the chopping switches 8, 15, which is equivalent to the arrangement of the chopping switches 8, 15 as shown in FIG. 1, as a pre-stage of the A/D converter 21. The chopping switch 8 is arranged between the output terminal of the short-circuit switch 9 and a common connection node between the first integral capacitor 7 and the input terminal of the quantizer 3. The input terminal of the chopping switch 15 is directly connected to the output terminal of the first operational amplifier 4.

The A/D converter 21 shown in FIG. 4 has a structure in which the chopping switches 8, 15 are merged into the chopping switch 15 only from the arrangement of the chopping switches 8, 15 in FIG. 5. The common connection node between the output terminal of the first operational amplifier 4 and the output terminal of the short-circuit switch 9 is defined as a first common connection node. The common connection node between the first integral capacitor 7 and the input terminal of the quantizer 3 is defined as a second common connection node. In this case, the chopping switch 15 is arranged between the first and second common connection nodes. In this way, the number of chopping switches can be reduced as compared with the structure according to the first embodiment.

Third Embodiment

Figure 6:
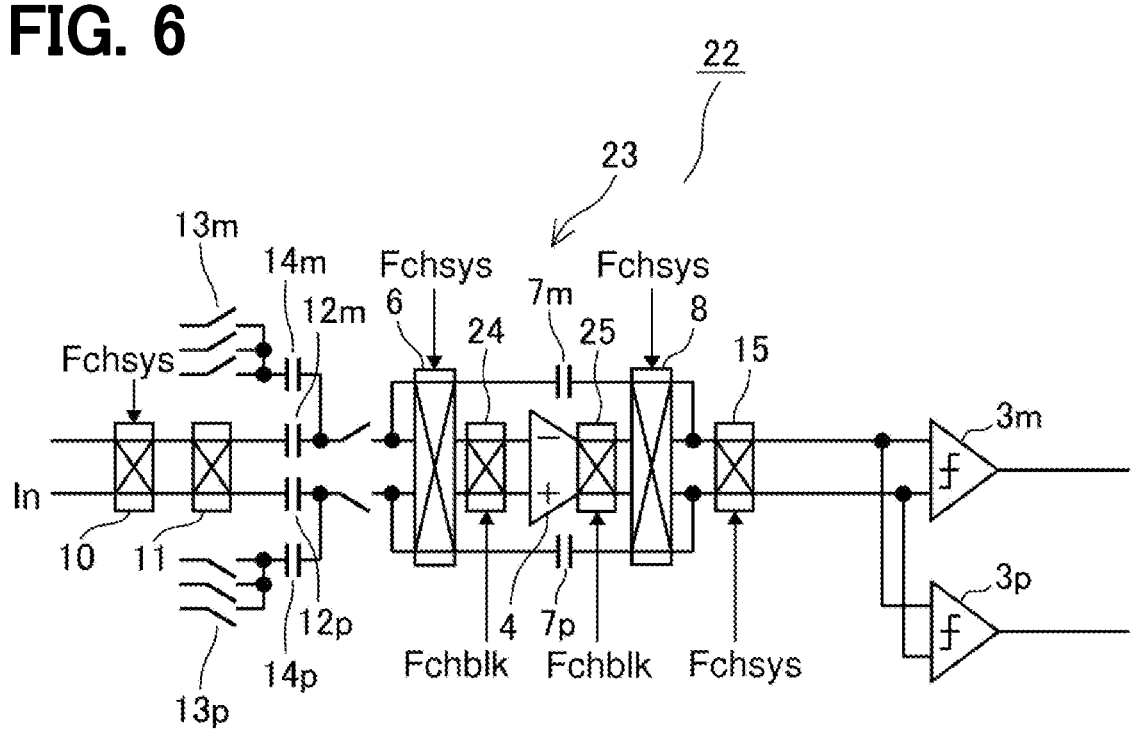
FIG. 6 illustrates a structure of an A/D converter according to a third embodiment.
Figure 7:
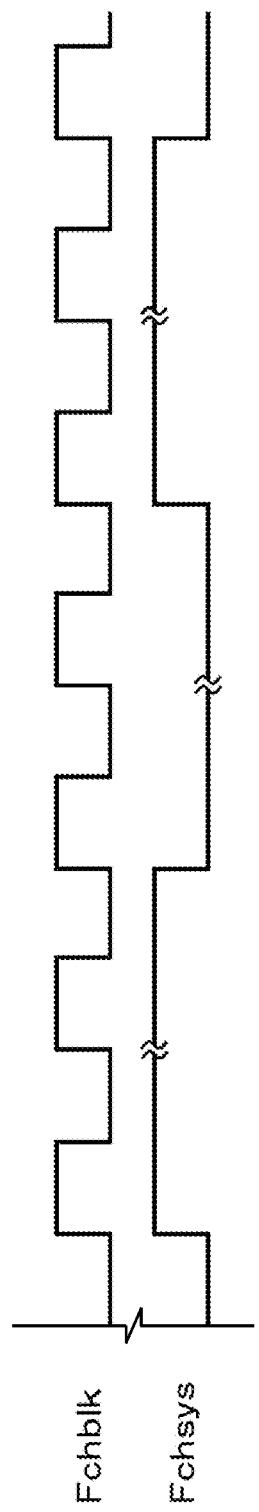
FIG. 7 illustrates an operation timing chart.

As shown in FIG. 6, an A/D converter 22 according to a third embodiment includes a first integrator 23 in replacement of the first integrator 2. In the first integrator 23, the switch 5 on the input side of the first integral capacitor 7 and the short-circuit switch 9 are removed. In addition, a chopping switch 24 and a chopping switch 25 are directly connected to the input terminal and output terminal of the first operational amplifier 4, respectively. As shown in FIG. 7, the chopping switches 24 and 25 execute chopping using a frequency Fchblk higher than the frequency Fchsys. In this case, the chopping switches 6, 8, and 15 may be arranged in the same manner as in the first embodiment.

Fourth Embodiment

Figure 8:
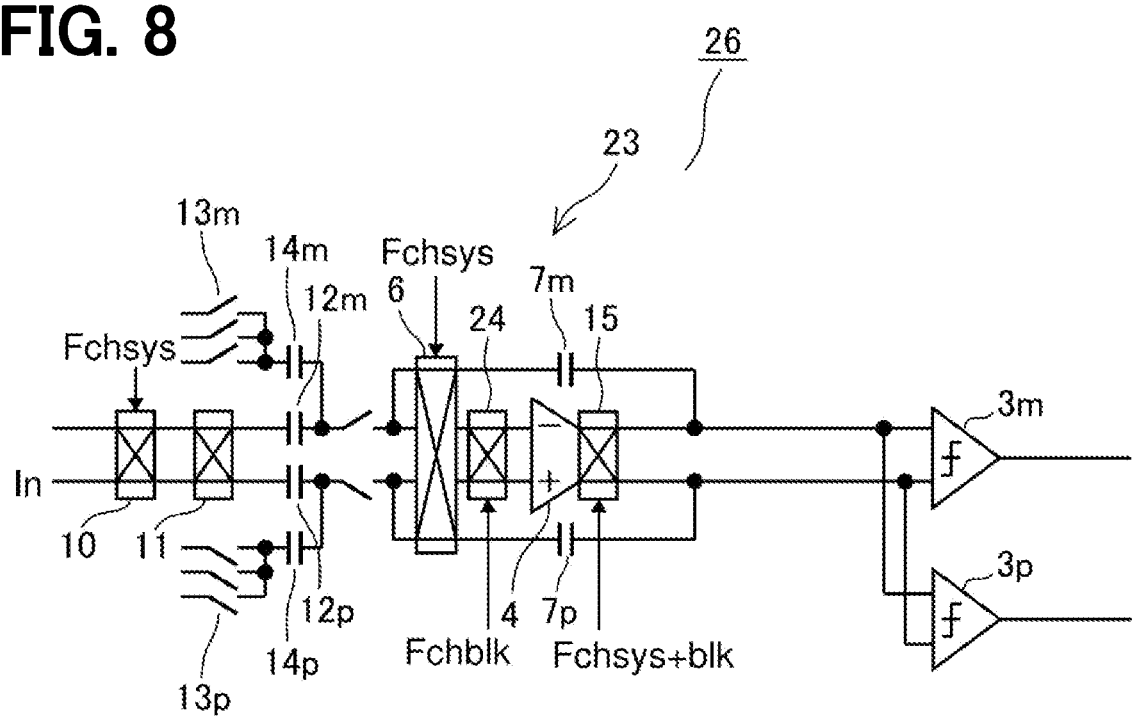
FIG. 8 illustrates a structure of an A/D converter according to a fourth embodiment.
Figure 10:
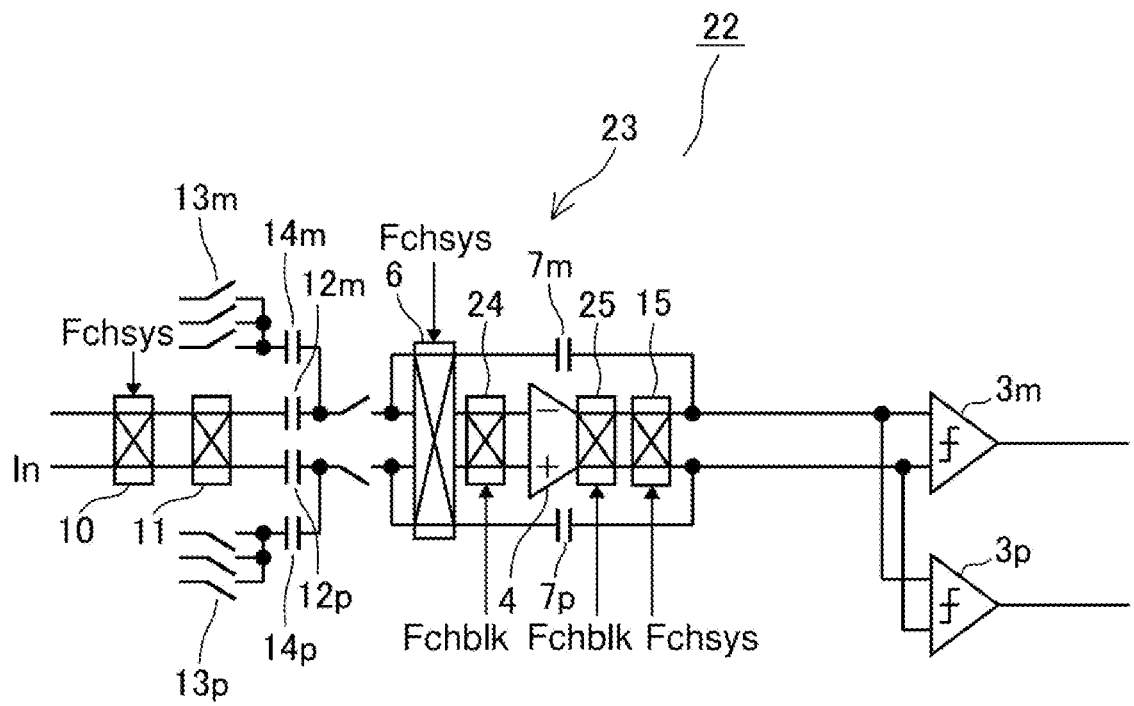
FIG. 10 illustrates a structure in which some chopping switches are merged into a switch in the A/D converter according to the third embodiment.

As shown in FIG. 8, the A/D converter 26 according to the fourth embodiment has a structure with fewer chopping switches than the A/D converter 22. FIG. 10 shows a structure in which the chopping switches 8 and 15 shown in FIG. 6 are merged as pre-stage of the A/D converter 26. The chopping switch 15 is arranged between the output terminal of the chopping switch 25 and a common connection node located between one end of the first integral capacitor 7 and the input terminal of the quantizer 3.

Figure 9:
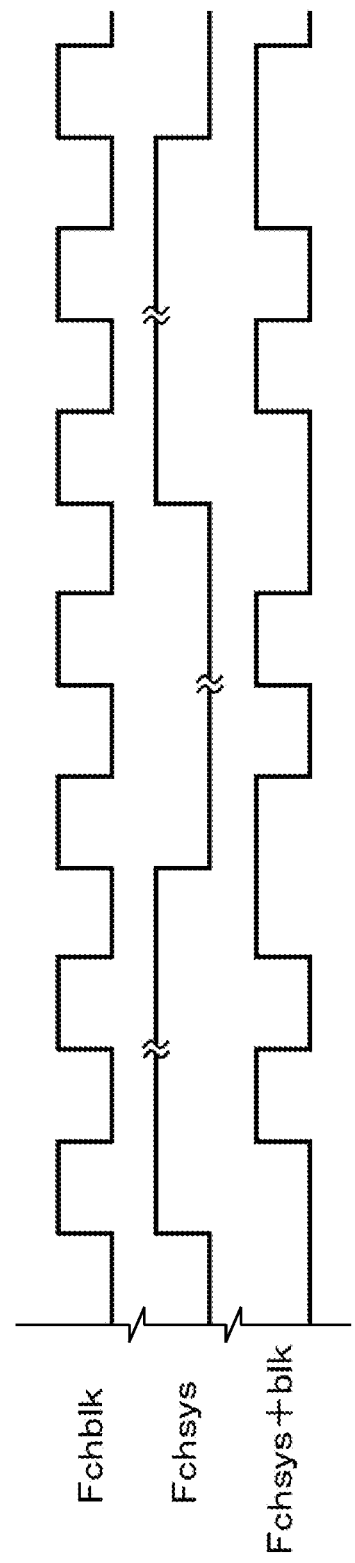
FIG. 9 illustrates an operation timing chart.

The structure shown in FIG. 8 is acquired by merging the chopping switches 25, 15 into a single chopping switch 15 from the structure shown in FIG. 10. The chopping of the chopping switch 15 is executed using a signal acquired by exclusive-OR operation of the signal Fchsys and the signal Fchblk as shown in FIG. 9. In this way, the number of chopping switches can be reduced as compared with the structure according to the third embodiment.

Fifth Embodiment

Figure 11:
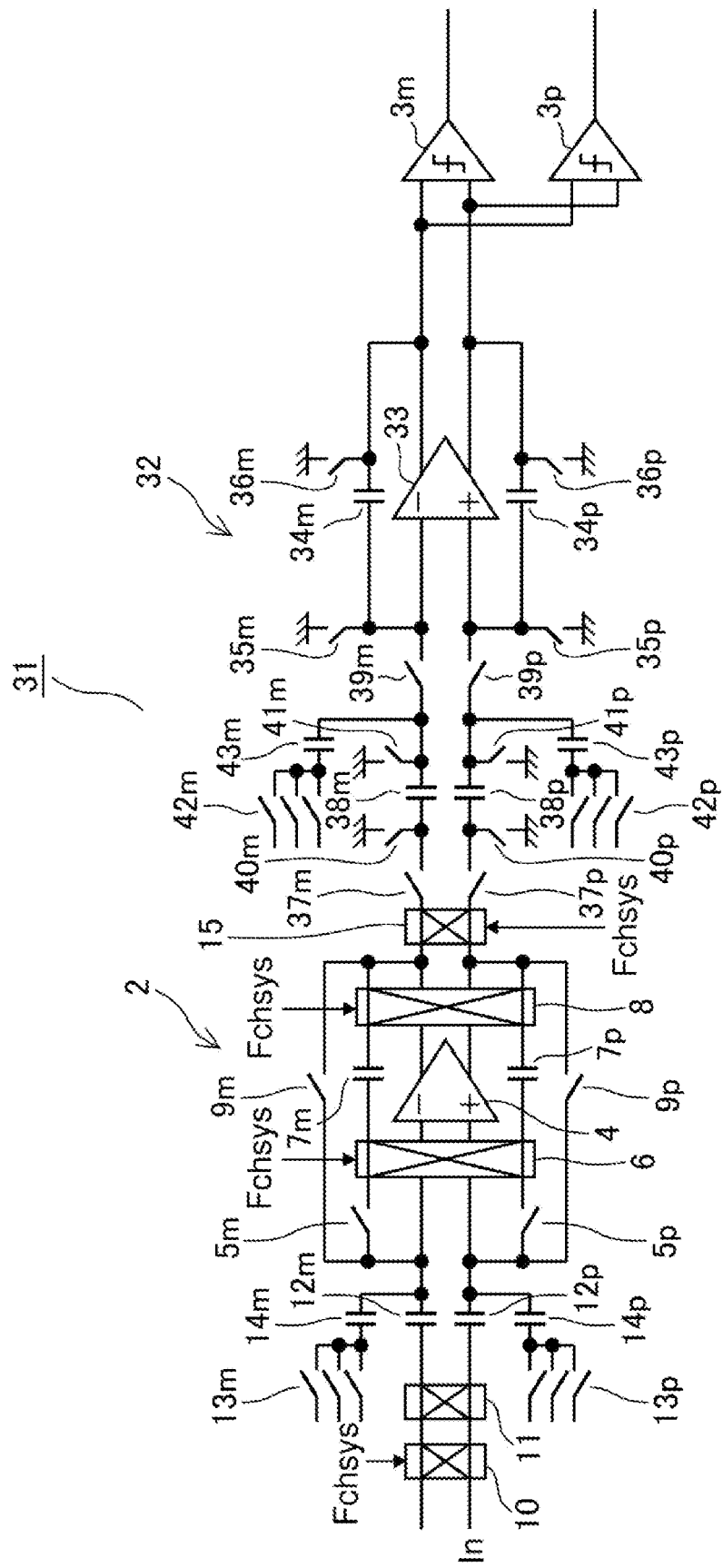
FIG. 11 illustrates a structure of an A/D converter according to a fifth embodiment.

As shown in FIG. 11, an A/D converter 31 according to a fifth embodiment has a structure in which a second integrator 32 is arranged between the first integrator 2 and the quantizer 3 according to the first embodiment. The second integrator 32 includes a differential amplifier 33 and an integrating capacitor 34. The integrating capacitor 34 is connected between the input and output terminals of the differential amplifier 33. Each of switches 35, 36 is connected between corresponding one of both ends of the integral capacitor 34 and the reference potential point.

A series circuit in which a switch 37, a sampling capacitor 38, and a switch 39 are connected in series is connected between the output terminal of the first integrator 2 and the input terminal of the differential amplifier 33. Each of switches 40 and 41 is connected between corresponding one of both ends of the sampling capacitor 38 and the reference potential point. A series circuit in which a DAC input switch 42 and a DAC capacitor 43 are connected in series is connected to the input terminal of the differential amplifier 33 as a connection portion of the feedback path as similar to the first integrator 2.

According to the fifth embodiment, the second integrator 32 is provided and the quantization noise level can be further reduced by applying an appropriate filter. Further, there is no need to provide a chopping switch for the second integrator 32.

Sixth Embodiment

Figure 12:
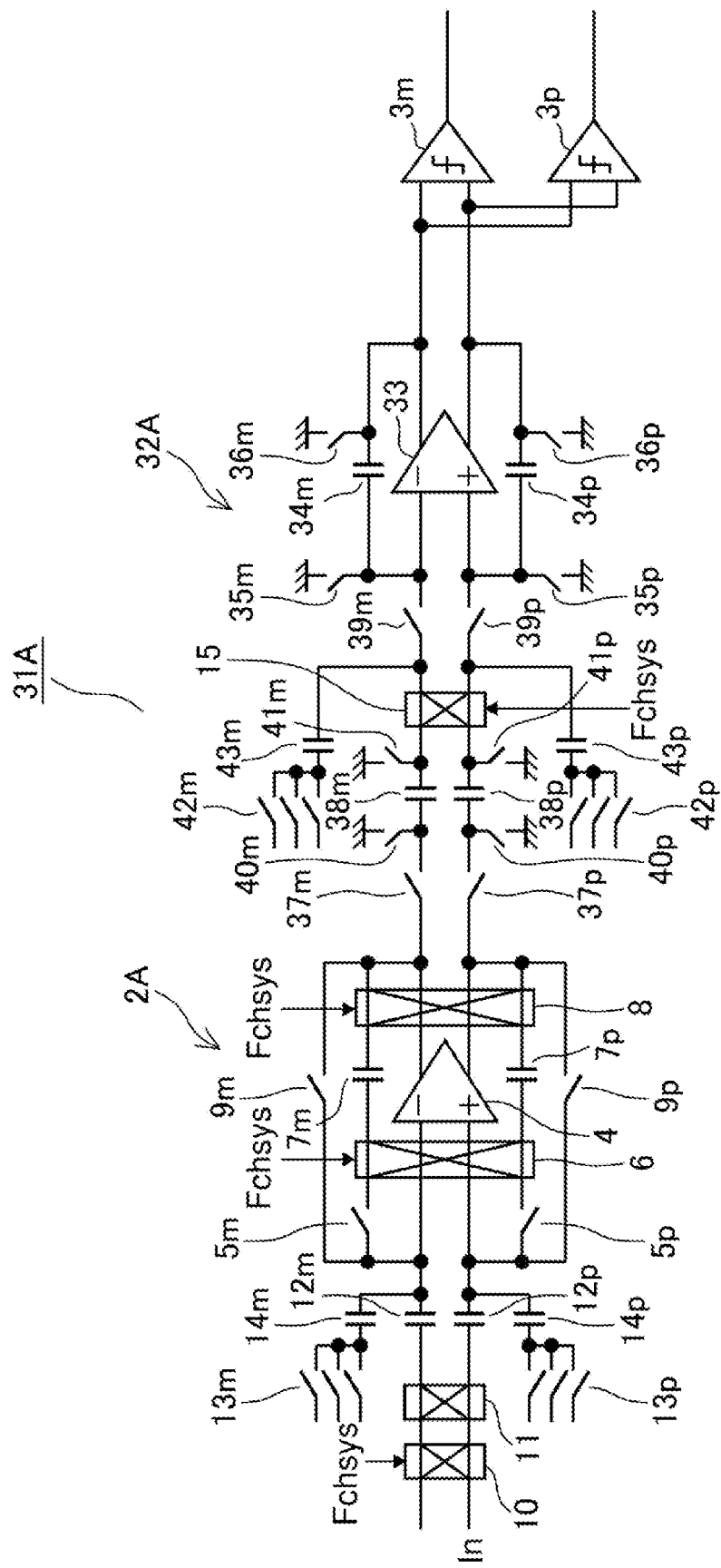
FIG. 12 illustrates a structure of an A/D converter according to a sixth embodiment.

As shown in FIG. 12, an A/D converter 31A according to a sixth embodiment has a structure in which the chopping switch 15 arranged at the first integrator 2 is located between the switch 41 of the second integrator 32 and a common connection node between the switch 39 and the DAC capacitor 43. An integrator without the chopping switch is a first integrator 2A, and an integrator with the chopping switch 15 is a second integrator 32A. According to the sixth embodiment, it is less susceptible to a variation in a sampling capacitor 38 of the second integrator 32A, as compared with the structure according to the fifth embodiment.

Seventh Embodiment

Figure 13:
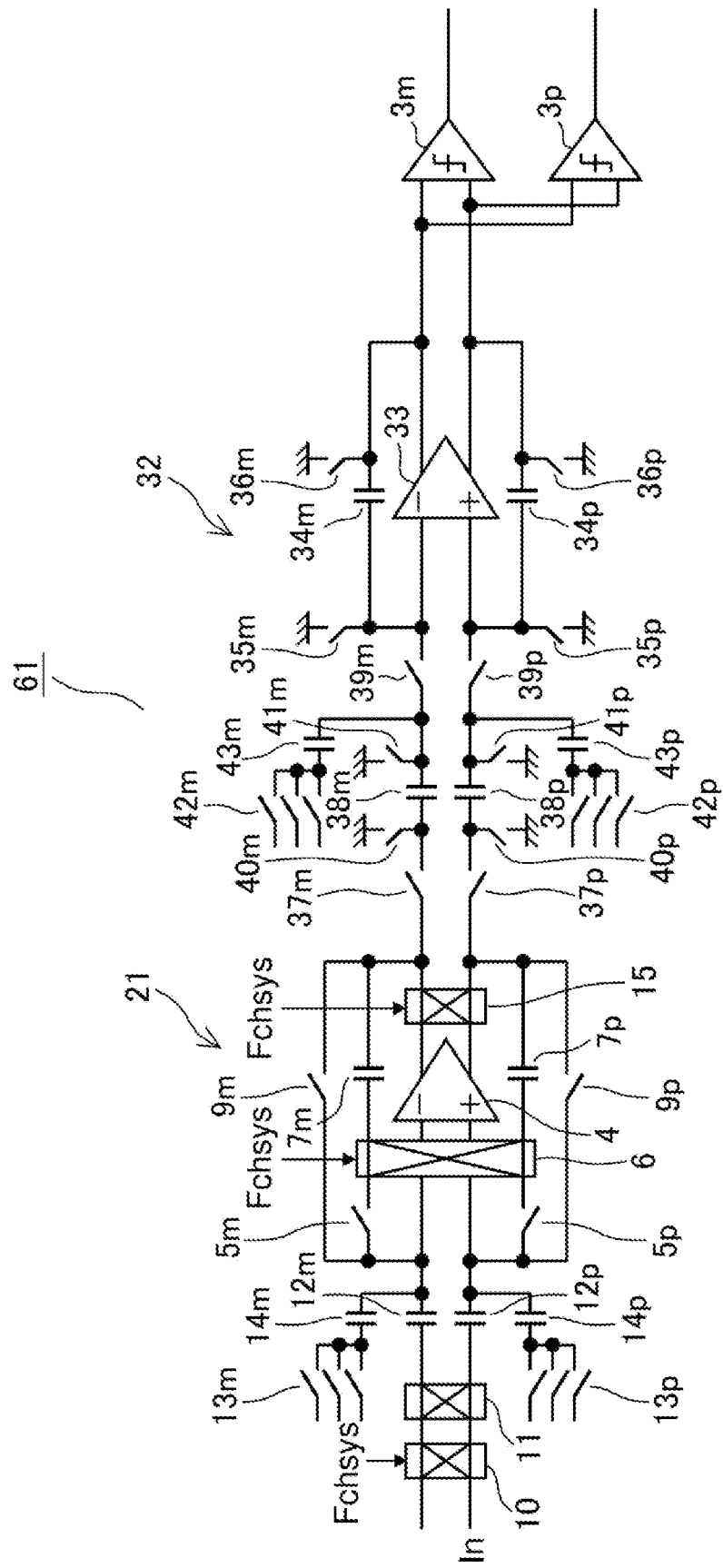
FIG. 13 illustrates a structure of an A/D converter according to a seventh embodiment.

As shown in FIG. 13, an A/D converter 61 according to a seventh embodiment has a structure in which the first integrator 2 of the A/D converter 31 is replaced by a first integrator 21.

Eighth Embodiment

Figure 14:
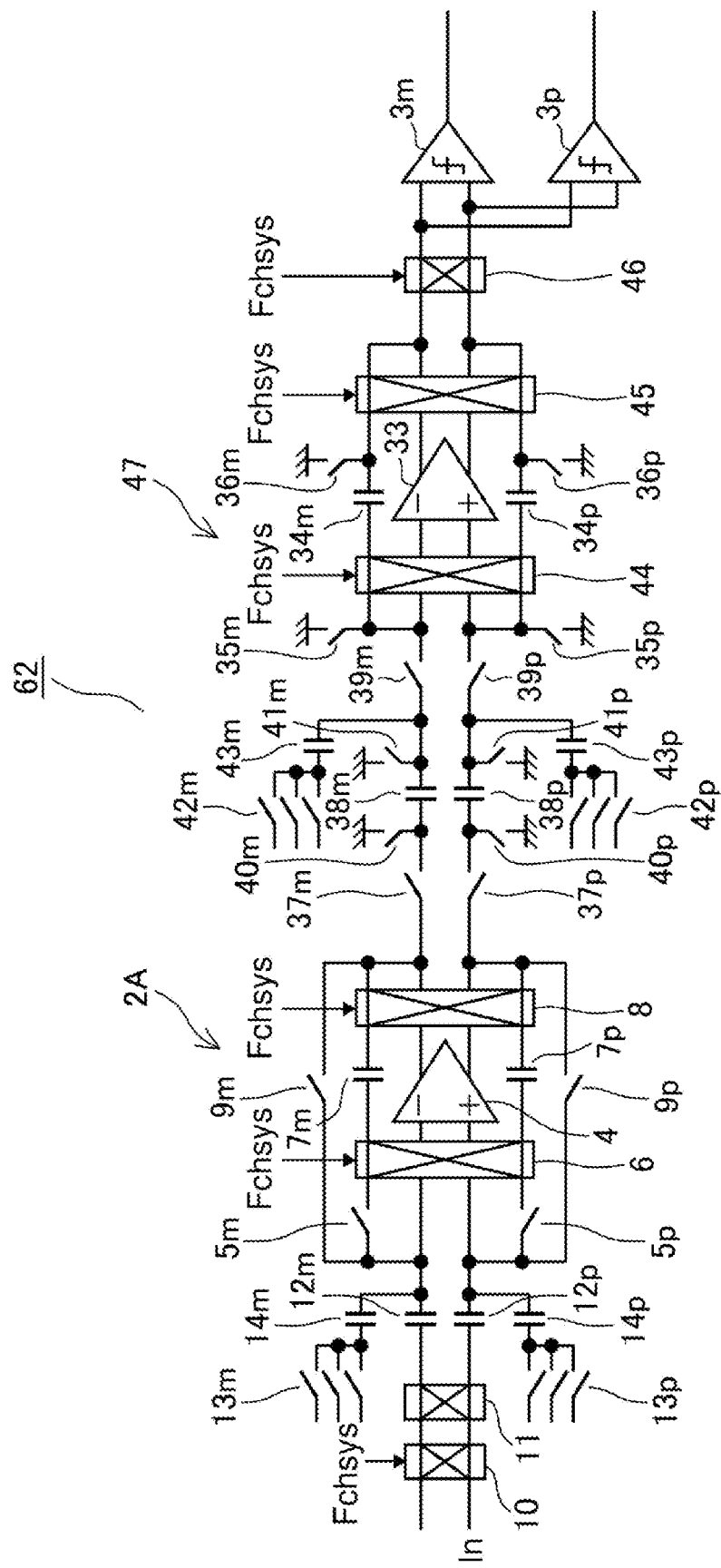
FIG. 14 illustrates a structure of an A/D converter according to an eighth embodiment.

As shown in FIG. 14, an A/D converter 62 according to an eighth embodiment has a structure in which: the second integrator 32A of the A/D converter 31A is replaced by the second integrator 47; each of chopping switches 44, 45 is provided at corresponding one of both ends of the integral capacitor 34; a chopping switch 46 is arranged at the input terminal of the quantizer 3. A second integrator 47 is constructed by adding the chopping switches 44, 45. According to the eighth embodiment, the influence of the offset of the second integrator 47 can be reduced.

Ninth Embodiment

Figure 15:
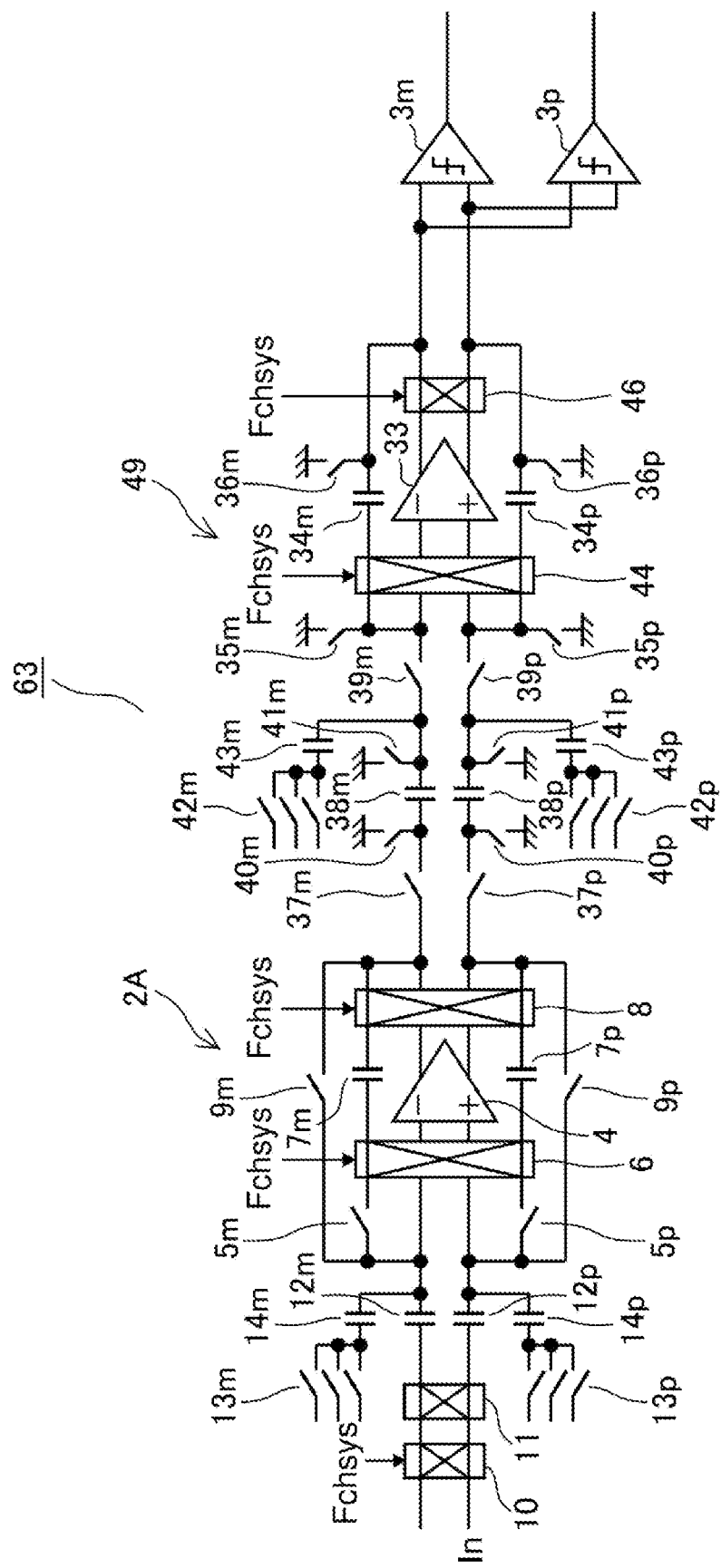
FIG. 15 illustrates a structure of an A/D converter according to a ninth embodiment.

As shown in FIG. 15, an A/D converter 63 according to a ninth embodiment has a structure in which: the chopping switches 45, 46 of the A/D converter 62 are merged; and the chopping switch 46 are arranged between the output terminal of the differential amplifier 33 and a common connection node between the quantizer 3 and the second integral capacitor 34. A second integrator 49 is constructed as described above.

Tenth Embodiment

Figure 16:
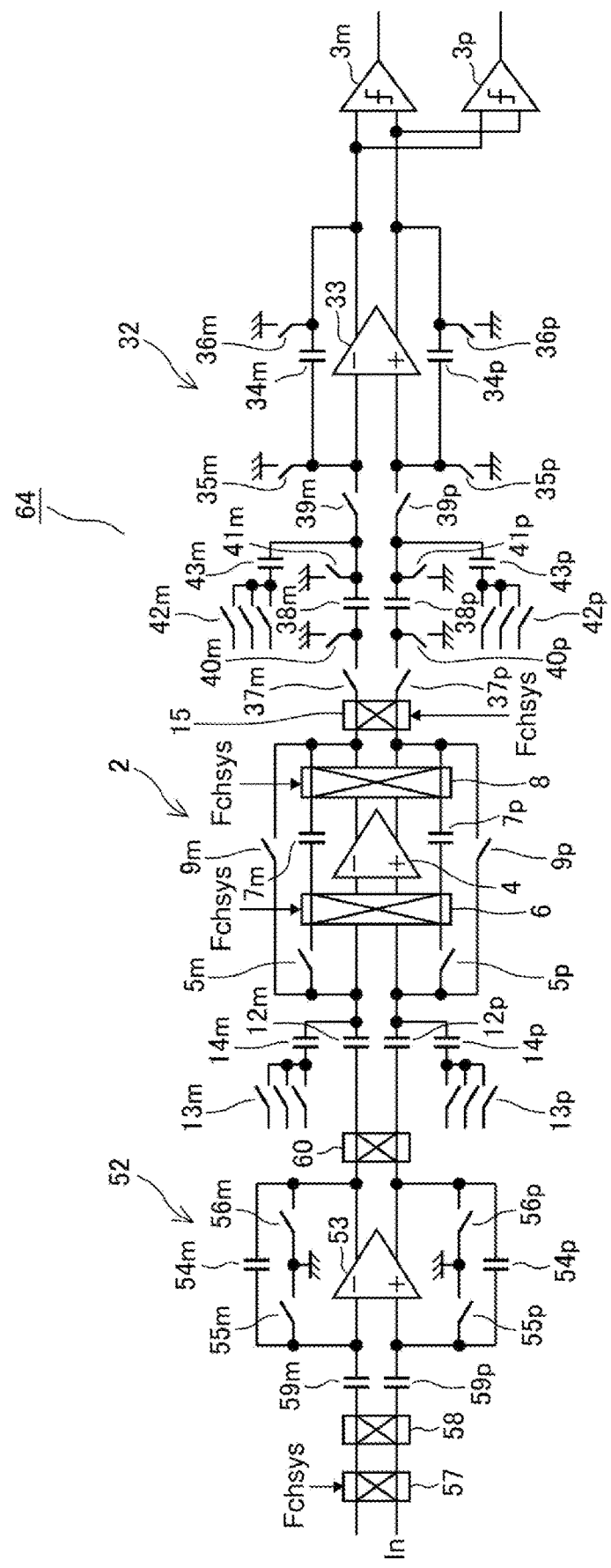
FIG. 16 illustrates a structure of an A/D converter according to a tenth embodiment.

As shown in FIG. 16, an A/D converter 64 according to a tenth embodiment has a structure in which an amplifier 52 is arranged at the input of the A/D converter 31. The amplifier 52 includes a differential amplifier 53 and an integral capacitor 54. The integral capacitor 54 is connected between the input and output terminals of the differential amplifier 53. Each of switches 55 and 56 is connected between corresponding one of both ends of the integral capacitor 54 and the reference potential point.

A series circuit in which chopping switches 57, 58 and a sampling capacitor 59 are connected in series is connected between a terminal to which an input voltage Vin is provided and the input terminal of the differential amplifier 53. A chopping switch 60 is arranged between the output terminal of the differential amplifier 53 and the input terminal of the first integrator 2. Chopping switches 58 and 60 are switches for double sampling. The amplifier 52 is a capacitively coupled amplifier.

According to a tenth embodiment, the noise resistance is enhanced by amplifying the input signal using the amplifier 52. When there is a resistance in the pre-stage of the A/D converter 51, it is possible to reduce the current flowing through the input wiring by reducing the capacitance value of the sampling capacitor 59. Therefore, it is possible to reduce an error of a voltage drop caused by the resistance in the pre-stage.

Eleventh Embodiment

Figure 17:
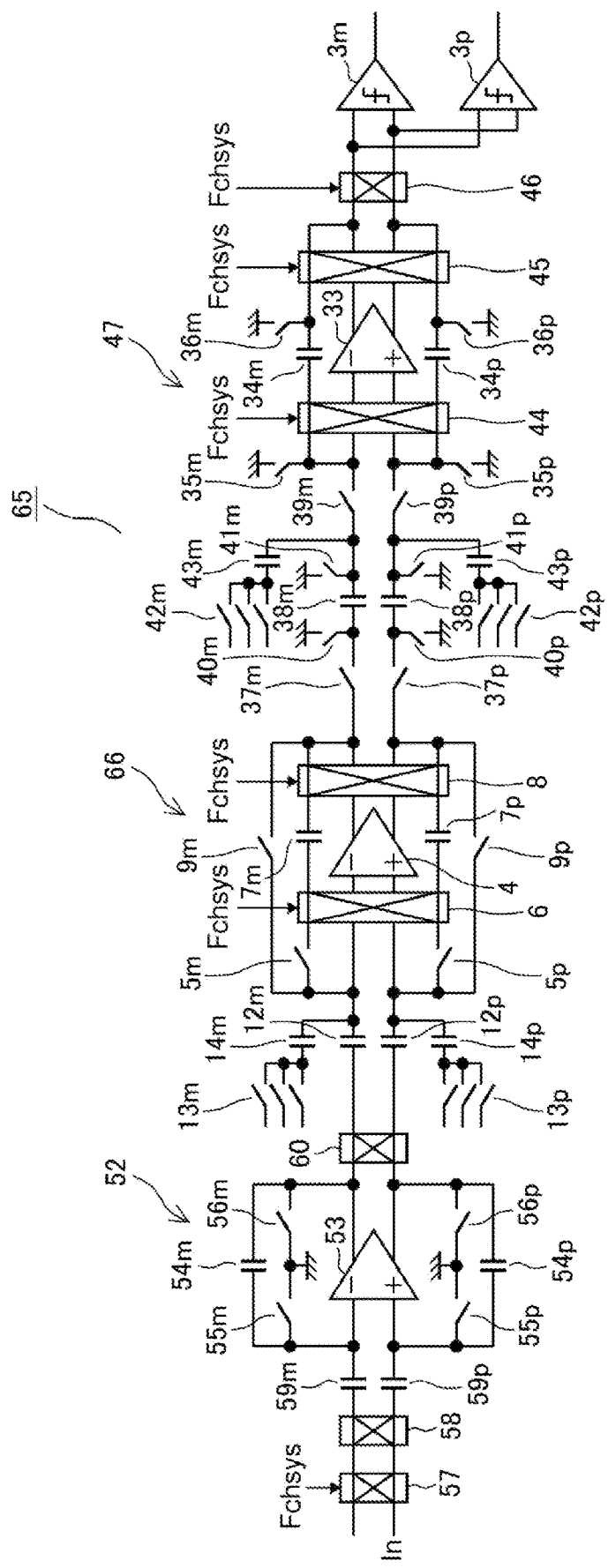
FIG. 17 illustrates a structure of an A/D converter according to an eleventh embodiment.

As shown in FIG. 17, an A/D converter 65 according to an eleventh embodiment has a structure in which the chopping switches 10 and 11 at the input of the A/D converter 62 are removed to connect the amplifier 52. The first integrator 66 is constructed by removing the chopping switches 10, 11.

Although the present disclosure has been described in accordance with the embodiments, it is understood that the present disclosure is not limited to such embodiments and structures. The present disclosure encompasses various modifications and variations within the scope of equivalents. Furthermore, various combination and formation, and other combination and formation including one, more than one or less than one element may be made in the present disclosure.

What is claimed is:

1. An analog-to-digital converter comprising:
   an input-signal chopping switch;
   an integrator being located after the input-signal chopping switch, the integrator including an operational amplifier, an integral capacitor, and a capacitor-chopping input switch, the capacitor-chopping input switch being located on an input side of the integral capacitor;
   at least one output-side chopping switch being located on an output side of the operational amplifier;
   a quantizer being located after the at least one output-side chopping switch; and
   a feedback chopping switch located in a feedback path from an output of the quantizer to an input of the integrator, wherein:
   the input-signal chopping switch, the at least one output-side chopping switch, the feedback chopping switch, and the capacitor-chopping input switch are configured to execute chopping at an identical frequency; and
   the at least one output-side chopping switch is further configured to set a polarity of an input value of the quantizer to be identical before and after the chopping.

2. The analog-to-digital converter according to claim 1, wherein:
   the at least one output-side chopping switch includes a first output chopping switch and a second output chopping switch;
   an output terminal of the first output chopping switch is connected to an input terminal of the quantizer; and
   an input terminal the second output chopping switch is connected to an output terminal of the integral capacitor, and an output terminal of the second output chopping switch is connected to a common connection node between an input terminal of the first output chopping switch and an output terminal of the operational amplifier.

3. The analog-to-digital converter according to claim 1, further comprising:
   a short-circuit switch configured to short-circuit a path between an input terminal of the operational amplifier and an output terminal of the operational amplifier, wherein:
   an input terminal of the at least one output-side chopping switch is connected to a common connection node between the output terminal of the operational amplifier and one end of the short-circuit switch; and
   an output terminal of the at least one output-side chopping switch is connected to a common connection node between an input terminal of the quantizer and one end of the integral capacitor.

4. The analog-to-digital converter according to claim 1, further comprising:
   an amplifier-input chopping switch connected to an input terminal of the operational amplifier; and
   an amplifier-output chopping switch connected to an output terminal of the operational amplifier, wherein:
   the amplifier-input chopping switch and the amplifier-output chopping switch are configured to execute chopping at a frequency being higher than the input-signal chopping switch;
   the at least one output-side chopping switch includes a first output chopping switch and a second output chopping switch;
   an output terminal of the first output chopping switch is connected to an input terminal of the quantizer; and
   an input terminal of the second output chopping switch is connected to an output terminal of the integral capacitor, and an output terminal of the second output chopping switch is connected to a common connection node between an input terminal of the first output chopping switch and an output terminal of the amplifier-output chopping switch.

5. The analog-to-digital converter according to claim 1, wherein:
   an amplifier-input chopping switch connected to an input terminal of the operational amplifier; and
   an amplifier-output chopping switch connected to an output terminal of the operational amplifier, wherein:
   the amplifier-input chopping switch and the amplifier-output chopping switch are configured to execute chopping at a frequency being higher than the input-signal chopping switch; and
   an input terminal of the at least one output-side chopping switch is connected to an output terminal of the amplifier-output chopping switch, and an output terminal of the at least one output-side chopping switch is connected to a common connection node between an input terminal of the quantizer and one end of the integral capacitor.

6. The analog-to-digital converter according to claim 1, wherein the integrator is a first integrator, the analog-to-digital converter further comprising:
a second integrator connected between the first integrator and the quantizer.

7. The analog-to-digital converter according to claim 6, wherein:
the operational amplifier is a first operational amplifier;
the integral capacitor is a first integral capacitor;
the capacitor-chopping input switch is a first-capacitor-chopping input switch; and
the at least one output-side chopping switch is a first-capacitor-chopping output switch located at an output of the first integral capacitor, the analog-to-digital converter further comprising:
at least one second-output-side chopping switch being located at an output of a second operational amplifier, wherein:
the second integrator includes the second operational amplifier, a second integral capacitor, and a second-capacitor-chopping input switch being located at an input of the second integral capacitor;
the input-signal chopping switch, the feedback chopping switch, the first-capacitor-chopping input switch, the first-capacitor-chopping output switch, the at least one second-output-side chopping switch, and the second-capacitor-chopping input switch are configured to execute chopping at an identical frequency; and
the at least one second-output-side chopping switch is configured to set a polarity of an input value of the quantizer to be identical before and after the chopping.

8. The analog-to-digital converter according to claim 7, wherein:
the at least one second-output-side chopping switch includes a first output chopping switch and a second output chopping switch;
an output terminal of the first output chopping switch is connected to an input terminal of the quantizer; and
an input terminal of the second output chopping switch is connected to an output terminal of the second integral capacitor, and an output terminal of the second output chopping switch is connected to an input terminal of the first output chopping switch.

9. The analog-to-digital converter according to claim 7, wherein an input terminal of the at least one second-output-side chopping switch is connected to an output terminal of the second operational amplifier, and an output terminal of the at least one second-output-side chopping switch is connected to a common connection node between an input terminal of the quantizer and one end of the second integral capacitor.

10. The analog-to-digital converter according to claim 6, further comprising:
an amplifier being located between the input-signal chopping switch and an input terminal of the first integrator.

11. The analog-to-digital converter according to claim 7, further comprising:
an amplifier being located between the input-signal chopping switch and an input terminal of the first integrator.

12. An analog-to-digital converter comprising:
an input-signal chopping switch;
an integrator being located after the input-signal chopping switch, the integrator including an operational amplifier, an integral capacitor, and a capacitor-chopping input switch, the capacitor-chopping input switch being located on an input side of the integral capacitor;
an output-side chopping switch being located on an output side of the operational amplifier;
a quantizer being located after the output-side chopping switch;
a feedback chopping switch located in a feedback path from an output of the quantizer to an input of the integrator; and
an amplifier-input chopping switch connected to an input terminal of the operational amplifier, the amplifier-input chopping switch configured to execute chopping at a frequency being higher than the input-signal chopping switch, the feedback chopping switch, and the capacitor-chopping input switch, wherein:
the input-signal chopping switch, the feedback chopping switch, and the capacitor-chopping input switch are configured to execute chopping at an identical frequency;
an input terminal of the output-side chopping switch is connected to an output terminal of the operational amplifier, and an output terminal of the output-side chopping switch is connected to a common connection node between an input terminal of the quantizer and one end of the integral capacitor;
the output-side chopping switch is configured to execute chopping through an exclusive-OR signal being a result of an exclusive-OR operation of a first signal and a second signal; and
the first signal causes the amplifier-input chopping switch to execute the chopping, and the second signal causes the input-signal chopping switch to execute the chopping.

* * * * *